United States Patent
Waters

(10) Patent No.: US 10,312,936 B2
(45) Date of Patent: Jun. 4, 2019

(54) USING CRC RESIDUAL VALUE TO DISTINGUISH A RECIPIENT OF A DATA PACKET IN A COMMUNICATION SYSTEM

(71) Applicant: Texas Instruments Incorporated, Dallas, TX (US)

(72) Inventor: Deric Wayne Waters, Dallas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 180 days.

(21) Appl. No.: 14/587,433

(22) Filed: Dec. 31, 2014

(65) Prior Publication Data

US 2015/0207521 A1 Jul. 23, 2015

Related U.S. Application Data

(60) Provisional application No. 61/928,731, filed on Jan. 17, 2014.

(51) Int. Cl.
*H03M 13/09* (2006.01)
*H03M 13/00* (2006.01)
(Continued)

(52) U.S. Cl.
CPC ......... *H03M 13/091* (2013.01); *H03M 13/09* (2013.01); *H03M 13/37* (2013.01);
(Continued)

(58) Field of Classification Search
CPC .. H03M 13/09; H03M 13/091; H03M 13/093; H03M 13/617; H03M 13/6502;
(Continued)

(56) References Cited

U.S. PATENT DOCUMENTS 5,935,269 A 8/1999 Kodama et al.
2004/0123221 A1* 6/2004 Huffman ............. H03M 13/093
714/776
(Continued)

FOREIGN PATENT DOCUMENTS

JP 2010244457 A 10/2010
RU 2304840 C1 8/2007

OTHER PUBLICATIONS

"Universal Serial Bus Power Delivery Specification," Revision 1.0, Including Errata Through Mar. 11, 2014 (Version 1.3), Chapter 5, 27 pages pages.

*Primary Examiner* — Christian M Dorman
(74) *Attorney, Agent, or Firm* — Michael A. Davis, Jr.; Charles A. Brill; Frank D. Cimino

(57) ABSTRACT

Methods and apparatus for operating a communication system comprising three or more communication transceivers. In illustrative embodiments, multiple different cyclic redundancy check (CRC) generation schemes are maintained. Each CRC generation scheme corresponds to a unique CRC residual value. A CRC value generated using one of the CRC generation schemes is placed in a data packet to be transmitted. The chosen CRC generation scheme reflects which one or more transceivers are intended recipients of the data packet. When a data packet is received by a transceiver, a CRC residual value is calculated based on the CRC value contained in the received data packet. The calculated CRC residual value is compared against a list of one or more valid CRC residual values for that particular transceiver. If the calculated CRC value matches one of the listed valid CRC residual values, the data packet is accepted, otherwise it is rejected.

12 Claims, 4 Drawing Sheets

(51) Int. Cl.
- H04L 1/00 (2006.01)
- H03M 13/37 (2006.01)
- *H04L 1/24* (2006.01)
- *G06F 11/10* (2006.01)

(52) U.S. Cl.
CPC ........ H03M 13/617 (2013.01); H04L 1/0041 (2013.01); H04L 1/0045 (2013.01); H04L 1/0061 (2013.01); *G06F 11/1004* (2013.01); *H03M 13/093* (2013.01); *H03M 13/6502* (2013.01); *H03M 13/6508* (2013.01); *H03M 13/6519* (2013.01); *H04L 1/242* (2013.01); *H04L 1/243* (2013.01); *H04L 2001/0093* (2013.01)

(58) Field of Classification Search
CPC .......... H03M 13/6508; H03M 13/6519; H04L 1/0061; H04L 1/242; H04L 1/243; G06F 11/1004
See application file for complete search history.

(56) References Cited

U.S. PATENT DOCUMENTS

| | | | |
|---|---|---|---|
| 2005/0154960 A1* | 7/2005 | Sydir | H03M 13/6516 714/758 |
| 2006/0075311 A1* | 4/2006 | Ranjan | H04L 1/0041 714/48 |
| 2007/0162609 A1* | 7/2007 | Pope | H04L 1/0061 709/230 |
| 2009/0077456 A1 | 3/2009 | Pi et al. | |
| 2010/0031129 A1* | 2/2010 | Hargan | G06F 11/1004 714/786 |
| 2010/0142450 A1 | 6/2010 | Kangude et al. | |
| 2010/0192051 A1 | 7/2010 | Kabulepa et al. | |
| 2012/0297207 A1* | 11/2012 | Carlsen | G06F 13/4081 713/300 |
| 2013/0007300 A1* | 1/2013 | Candelaria | G06F 3/0659 710/5 |

\* cited by examiner

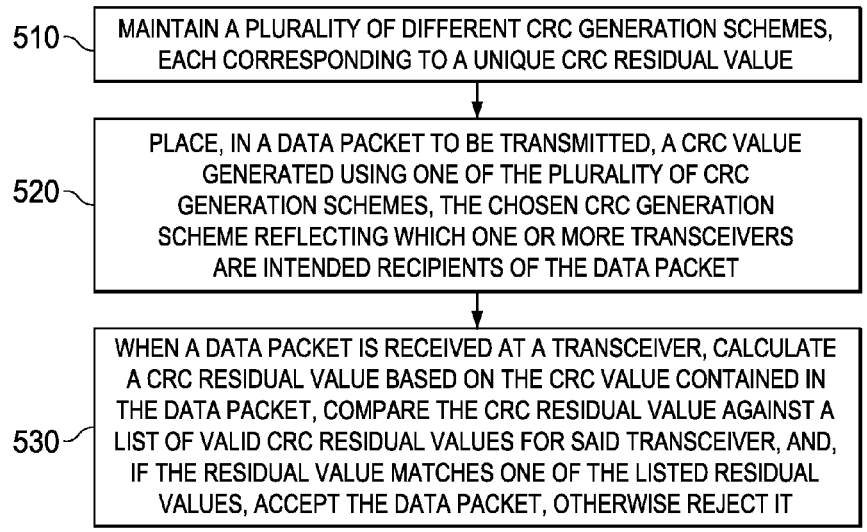
FIG. 5
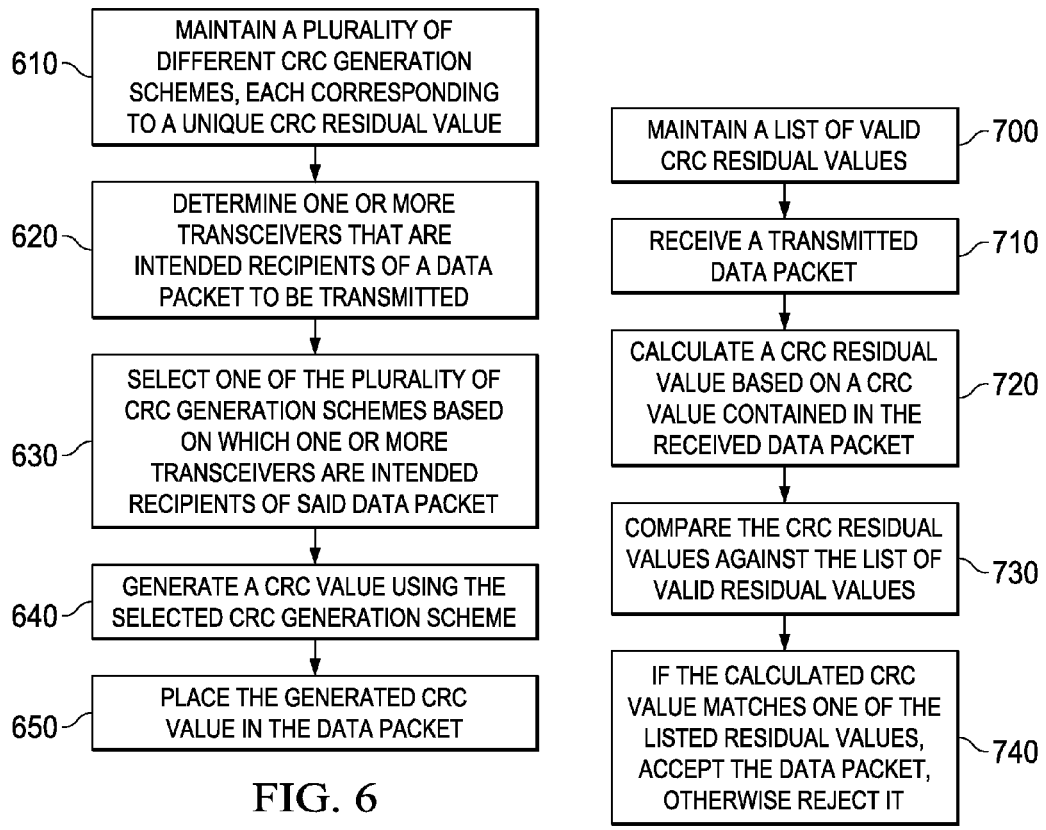
FIG. 6
FIG. 7

USING CRC RESIDUAL VALUE TO DISTINGUISH A RECIPIENT OF A DATA PACKET IN A COMMUNICATION SYSTEM

BACKGROUND

Universal Serial Bus (USB) is an industry standard that defines the cables, connectors and communications protocols used in a bus for connection, communication, and power supply between computers and electronic devices. USB was designed to standardize the connection of computer peripherals (including keyboards, pointing devices, digital cameras, printers, portable media players, disk drives and network adapters) to personal computers, both to communicate and to supply electric power. It has become commonplace on other devices, such as smartphones, PDAs and video game consoles. USB has effectively replaced a variety of earlier interfaces, such as serial and parallel ports, as well as separate power chargers for portable devices.

A new USB Power Delivery Specification has been developed to enable delivery of higher power over new USB cables and connectors. This technology creates a universal power plug for laptops, tablets, etc. that may require more than five volts using cables and plugs compatible with existing USB solutions. The USB Power Delivery (USB-PD) Specification defines a packet-based communication link between ports connected via a USB-PD cable and USB-PD connectors. The packets contain information that enables the two ports to communicate and negotiate a voltage and a current that the source port will provide to the sink port. This communication occurs on a separate wire independently from the normal USB communications that appear on the USB data wires.

It has been proposed to incorporate an in-line transceiver inside a USB-PD cable as a way of communicating information about the cable to USB devices that the cable is connected to. Such an in-line transceiver illustratively would include or be associated with a non-volatile memory that stores information that the transceiver can send to such connected devices. In most embodiments, the in-line transceiver would be coupled with an embedded processor. Some examples of information that could be stored in the memory and transmitted to connected devices include: current and voltage capabilities of the cable, the cable manufacturer, the length of the cable, and an indication of whether the cable is active or passive. However, adding a transceiver inside the cable means that there are multiple possible destinations for any message sent by one of the three transceivers now associated with the cable (one at each end plus the at least one in-line transceiver). Thus there is a need for a simple and efficient means for a transmitter and a receiver to distinguish intended recipients of a transmitted message.

SUMMARY

One embodiment of the present disclosure is directed to a method of operating a communication system comprising three or more communication transceivers. Pursuant to such a method, multiple different cyclic redundancy check (CRC) generation schemes are maintained. Each CRC generation scheme corresponds to a unique CRC residual value. A CRC value generated using one of the CRC generation schemes is placed in a data packet to be transmitted. The chosen CRC generation scheme reflects which one or more transceivers are intended recipients of the data packet. When a data packet is received by a transceiver, a CRC residual value is calculated based on the CRC value contained in the received data packet. The calculated CRC residual value is compared against a list of one or more valid CRC residual values for that particular transceiver. If the calculated CRC value matches one of the listed valid CRC residual values, the data packet is accepted, otherwise it is rejected.

BRIEF DESCRIPTION OF THE DRAWINGS

FIG. 5 is a flowchart representing a method of operating a communication system comprising three or more communication transceivers.

FIG. 6 is a flowchart representing a method of operating a data transmitter to indicate an intended one or more recipients of a data packet to be transmitted.

FIG. 7 is a flowchart representing a method of operating a data receiver to determine if it is an intended recipient of a received data packet.

DETAILED DESCRIPTION

This disclosure is directed generally towards methods and apparatus for using cyclic redundancy check (CRC) codes to distinguish intended recipients in a multi-transceiver communication system. Such methods and apparatus will be described herein with respect to a USB communication system. However, it is to be understood that the methods and apparatus described herein can pertain to, and be implemented in, any communication system that consists of three or more transceivers and that uses cyclic redundancy check.

Figure 1:
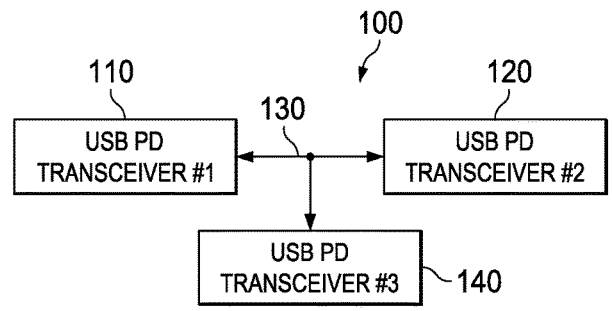
FIG. 1 is a block diagram representing a USB communication system that includes two USB devices connected by a USB cable that has an in-line transceiver embedded in the cable.

FIG. 1 is a block diagram representing a USB communication system 100 that includes two USB devices connected by a USB cable that has an in-line transceiver embedded in the cable. The USB communication system 100 comprises a first USB power delivery (USB-PD) device 110 connected to a second USB-PD device 120 via USB-PD cable 130. In USB power delivery, there are four kinds of devices defined: provider-only, provider/consumer, consumer/provider, and consumer-only. USB-PD devices 110 and 120 could each be any of these four types of devices. Each USB device 110, 120 includes a USB-PD transceiver for sending and receiving messages pertaining to the delivery of power over the USB-PD cable 130. USB-PD transceiver 140 is an in-line transceiver that is embedded in the USB-PD cable 130. The transceiver 140 illustratively includes or is associated with a non-volatile memory that stores information that the transceiver can send to USB-PD device 110 and/or USB-PD device 120. In some embodiments, the in-line transceiver 140 is coupled with an embedded processor. Some examples of information that can be stored in the memory and transmitted to device 110 and/or device 120 include: voltage capabilities of the cable, current capabilities of the cable, the cable manufacturer, the length of the cable, and an indication of whether the cable is active or passive.

Figure 2:
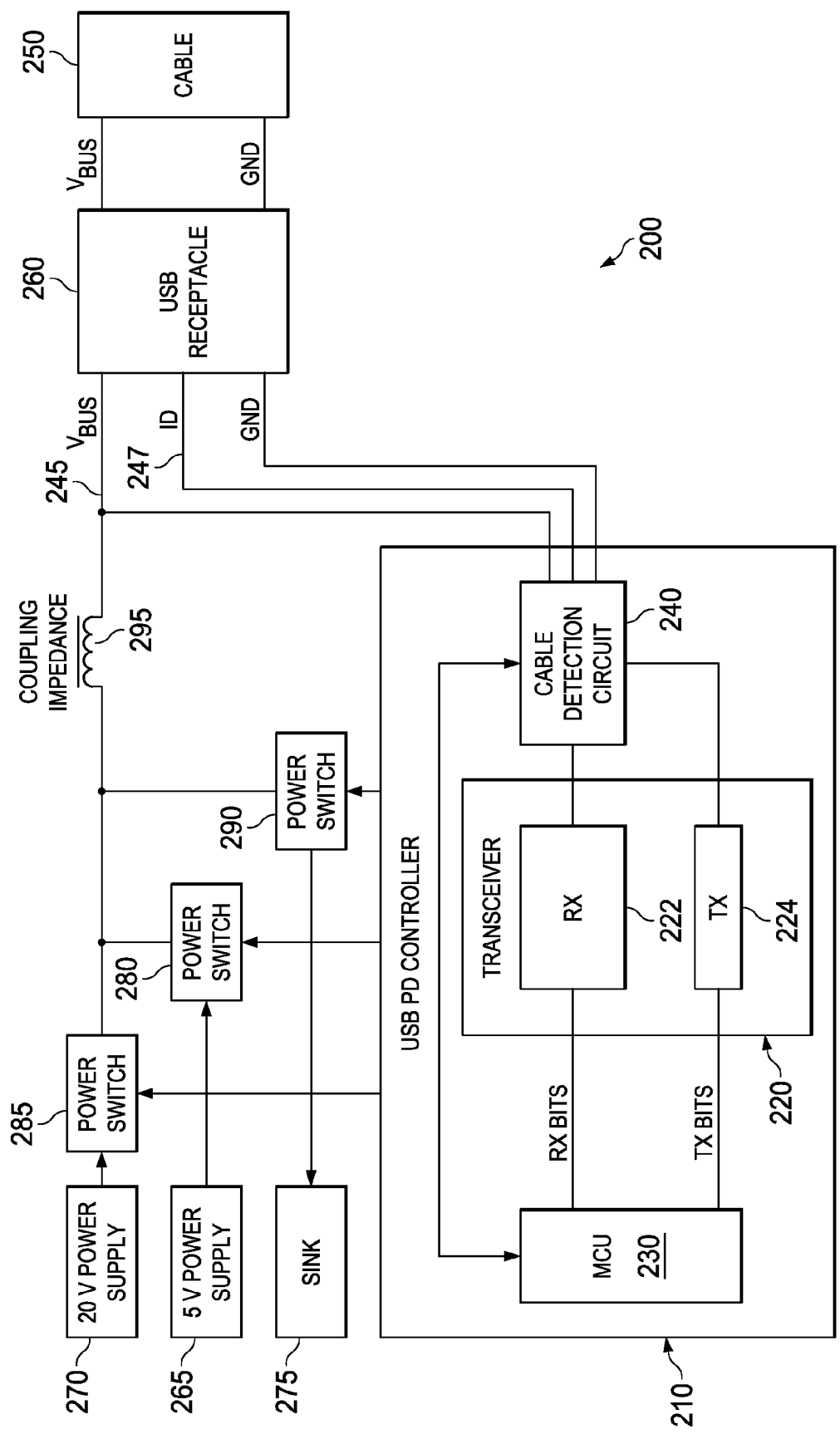
FIG. 2 is a block diagram representing an illustrative USB power-delivery device.

FIG. 2 is a block diagram representing an illustrative USB power-delivery (USB-PD) device 200. The device 200 of FIG. 2 can both source and sink power and therefore can function as either a provider or consumer USB power-delivery device. The illustrative USB-PD device 200 of FIG. 2 could represent device 110 of FIG. 1, device 120 of FIG. 1, or both. The USB power-delivery device 200 includes a USB receptacle 260 that is capable of attachably receiving a USB connector disposed on one end of a USB cable 250, as is well known in the art. The other end of the USB cable can be permanently attached to a second USB device, or can terminate at a second USB connector that can be attachably connected to a second USB-capable device. In still another embodiment, the USB cable 250 can be permanently affixed to the USB device 200. The USB power-delivery device 200 also includes a USB-PD controller 210 that controls the communications with other USB power delivery devices, via the USB cable 250, regarding power delivery, and also controls the actual sourcing of power to, or sinking of power received from, another USB power delivery device. In an illustrative embodiment, the USB cable 250 has an in-line transceiver embedded in the cable, such as the USB-PD transceiver 140 described above with respect to FIG. 1.

The USB-PD controller 210 includes a transceiver 220, a microcontroller unit 230, and a cable-type detection circuit 240. The transceiver 220 includes a receiver 222 and a transmitter 224. In an illustrative embodiment, the transceiver 220 comprises a frequency-shift keying (FSK) modem. The receiver 222 receives communications regarding USB power delivery from a far-end USB power-delivery device, or from an in-line transceiver embedded in the USB cable 250, as will be described in more detail below. The transmitter 224 transmits communications regarding USB power delivery to a far-end USB power-delivery device, or to an in-line transceiver embedded in the USB cable 250. Such communications with a far-end device regarding USB power delivery can include the negotiating of which device is to be the source (provide power) and which is to be the sink (receive power), and the negotiating of the voltage, current, and mode of the power delivery, as well as other information attendant to the delivery of power from one device to the other over the USB cable 250. Such communications with an in-line transceiver embedded in the USB cable 250 can include, for example, communications regarding the current and voltage capabilities of the cable, the cable manufacturer, the length of the cable, and an indication of whether the cable is active or passive.

The transceiver 220 communicates with the far-end USB device and any in-line transceiver via the voltage bus (Vbus) 245. The microcontroller unit 230 controls the operations of the USB-PD controller 210, generates messages to be sent to the far-end USB device and/or an in-line transceiver, and processes messages received from the far-end USB device or the in-line transceiver. One function performed by the microcontroller 230 is the selection of power supplies to be provided to the Vbus 245 in order to power a connected far-end device. The microcontroller can make this determination based upon a variety of factors. One such factor is what type and/or level of power supply is being requested by the far-end of device. Such requests are received from the far-end device via Vbus 245. Another such factor can be what type of USB cable 250 is inserted in the USB receptacle 260 and what power delivery mode or modes are appropriate for that USB cable type. Such cable-type information can be received from an in-line transceiver embedded in the USB cable 250 via Vbus 245. The USB-PD controller 210 also includes a cable detection circuit 240 that receives a cable identification signal 247 from the USB receptacle 260. Based on the cable identification signal 247 received from the USB receptacle 260, the cable detection circuit determines whether a cable is inserted in the USB receptacle 260. In some embodiments the ID wire 247 may actually be two separate wires commonly known as CC1 and CC2 in a Type-C USB connector. Additionally, in some embodiments, the cable ID signal 247 can also include cable-type information provided by the USB receptacle 247.

The USB power-delivery device 200 shown in FIG. 2 also includes two power supplies: 5-volt power supply 265 and 20-volt power supply 270. It will be appreciated that this embodiment is merely illustrative and that the USB power-delivery device 200 can include additional power supplies as well, or a single power supply whose voltage can be changed. The USB power-delivery device 200 also includes a power sink 275 that can receive power supplied over the Vbus 245 to power the USB power-delivery device 200. The USB power-delivery device 200 further includes power switches 280, 285, 290. The USB-PD controller 210 controls the power switches 280, 285, 290 in order to select a power supply and to couple the selected power supply to the Vbus 245 through the coupling impedance 295, or to couple the power sink 275 to the Vbus 245 if the USB power-delivery device 200 is to receive power from a far-end device. In some embodiments the coupling impedance 295 may not be present.

As mentioned, the USB-PD device 200 of FIG. 2 is capable of acting as a USB-PD provider or as a USB-PD consumer. An illustrative provider-only USB-PD device would include similar functionality as the device 200 of FIG. 2 but would not include the power sink 275. Similarly an illustrative consumer-only USB-PD device would include functionality similar to the device 200 but would not include the power supplies 265 and 270. An illustrative embodiment of the in-line transceiver 140 of FIG. 1 would not include either the power supplies 265, 270 or the power sink 275, but would comprise a transceiver similar to the transceiver 220 of FIG. 2, and a microcontroller similar to the microcontroller 230 of FIG. 2.

Figure 3:
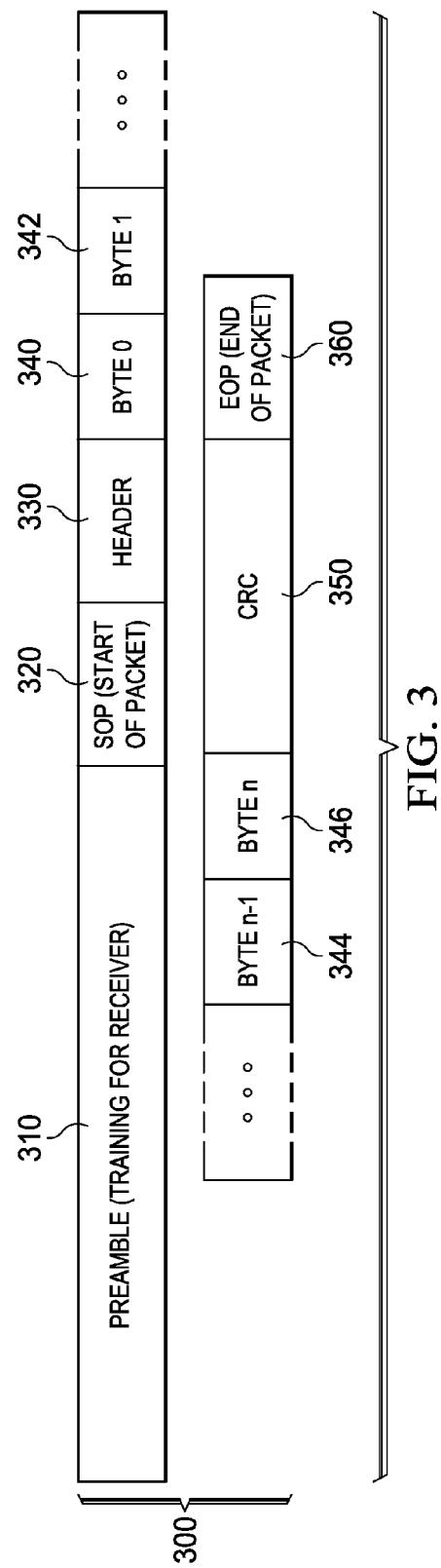
FIG. 3 is a data structure diagram representing the structure of a USB-PD data packet.

There is a physical layer built around a USB-PD transceiver, such as the transceiver 220 of FIG. 2, that allows the USB power-delivery device 200 and a far-end USB device to send power-delivery messages to one another over Vbus 245, and also allows the device 200 to communicate with an in-line transceiver that may be embedded in the USB cable 250. Above the physical layer is a protocol layer, and then a policy engine layer. In illustrative embodiments, the physical layer uses binary frequency shift keying (FSK) modulation or biphase mark coding (BMC). The physical layer also encodes the data bits in the packet using, for example, 4b5b encoding. The packet format of a power-delivery data packet, according to an illustrative embodiment, is shown in FIG. 3. Each packet 300 begins with a preamble 310 which contains a sequence of alternating ones and zeros for a total of 64 bits. The preamble 310 is followed by a start-of-packet delimiter (SOP) 320, which is a predefined 20-bit code word that announces the start of a new data packet. The SOP 320 is followed by a header (that is encoded using the 4b5b code) which contains information used by the protocol layer. Among other information contained in the header 330 is a message-type field that indicates what kind of message the packet 300 represents. The header 330 also includes a data field (sometimes referred to as Nobj) that indicates the number of data objects that follow in the packet.

Following the header 330 are one or more data fields 340, 342, 344, 346, encoded using the 4b5b code. For example, in a specific type of message known as a source capabilities message, the data fields 340-346 comprise data structures known as power delivery objects. The source capabilities message is a message that is sent by a USB-PD source device such as device 200 to broadcast its availability as a power source and to communicate the device's capabilities as a source. These capabilities are enumerated in the power delivery objects. The data fields 340-346 are followed by a 32-bit cyclic redundancy check (CRC) 350. The CRC 350 is an error-detecting code used to detect accidental changes to the data contained in the data packet 300. The CRC is computed based on the header 330 and the data objects 340-346. The CRC is the 32-bit remainder of a polynomial division of the contents of the header 330 and the power delivery objects, encoded into 40 bits using the 4b5b code, as will be described in more detail below. Upon retrieval of the data packet by, say, a second USB device, the calculation is repeated, and corrective action can be taken against presumed data corruption if the check values do not match. Finally, the CRC 350 is followed by a predefined 5-bit end-of-packet delimiter (EOP) announcing the end of the data packet 300.

Per the USB specification, the input to the CRC calculation, i.e., the dividend, is the portion of the packet 300 that runs from the header 330 to the last byte of data 346. The input thus begins at bit 0 of the header 330 and continues to bit 7 of the last data byte 346. The USB specification defines a generator polynomial of 04C11DB7h (the "h" indicating hexadecimal). This input data is divided by the generator polynomial (the divisor). Per the USB specification, all the flip-flops of a shift register used to perform the polynomial division are preloaded with 1s. Thus the initial value of the shift register is FFFFFFFFh. Without this measure, leading 0s at the beginning of a packet would not be protected by the CRC generated. In the CRC implementation defined in the USB specification, the remainder of the polynomial division is complemented, i.e., bit-wise inverted. This complemented remainder constitutes the CRC checksum value. This CRC value 350 is then placed in the data packet 300 to be transmitted. Without the complementing of the remainder as prescribed by the USB specification, trailing zeros at the end of a packet could not be detected as data transmission errors. Mathematically, the complementing of the remainder is equivalent to adding a known constant to the remainder. This is mathematically insignificant to the operation of CRC. In equation form, $CRC=L(x)+R(x)$, where $L(x)$ is a degree $(d-1)$ polynomial with all coefficients equal to one and d is a degree of the generator polynomial, and where $R(x)$ is the remainder obtained by dividing $D(x)$ by the generator polynomial $G(x)$.

Checking the CRC at the receiving transceiver is the same as generating the CRC on an input pattern which now consists of the original input pattern followed by the inverted remainder. Mathematically, this new polynomial should be perfectly divisible by the generator polynomial except for a residual value resulting from the known constant $L(x)$ that was added to the remainder at the transmitting device as described above. This can be intuitively understood by recognizing that the appending of the remainder to the least significant bit of the dividend is equivalent to subtracting it from the old dividend. In equation form, the transmitted and received data is $M(x)=x^{32}F(x)+CRC$. When the CRC calculation is performed on this pattern $M(x)$, the remainder $R'(x)$ is $x^{32}L(x)/G(x)$ and can be derived from the above equations and some properties of modulo 2 arithmetic. $R'(x)$ is termed the residual polynomial, or the residue, and is a unique polynomial (i.e., it's coefficients are always the same) since $L(x)$ and $G(x)$ are unique. Thus, per the USB specification, the residual of the CRC-32 calculation shall be C704DD7Bh or else the packet is discarded.

Per the USB specification, when a device receives a message that successfully passes this CRC check, the device sends a control message called a Good CRC message to the transmitting device. The Good CRC message indicates that the message has been received and that the CRC check values matched.

Referring again to FIG. 1, the presence of the in-line transceiver 140 in the USB cable 130 means that there are three transceivers in the USB communication system 100, and thus there are two possible destinations for a message sent by any of the transceivers 110, 120, 140. The present disclosure presents a method of distinguishing which messages are meant for which transceiver. To allow the transceiver 140 in the cable to be as simple as possible, a mechanism at the physical layer or protocol layer is preferable so it doesn't need to parse too many different kinds of messages. This disclosure presents a physical layer solution that uses two or more unique CRC generation schemes to distinguish the intended recipient of a message. USB-PD receivers are required to reject packets whose CRC fails, i.e., whose residual value is not C704DD7Bh. According to illustrative embodiments, each of the maintained CRC generation schemes will result in a unique residual value at the target transceiver. In this scheme, certain transceivers will accept packets whose CRC calculation gives certain specific CRC residual values that are not equal to the legacy USB-PD residual value of C704DD7Bh. Each transceiver will have one or more residual values that it will accept. Illustratively, each transceiver will maintain a list of one or more valid residual values, i.e., residual values which that transceiver will accept. When a transceiver receives a transmitted data packet, it will perform the CRC calculation to find the residual value. If the calculated residual value matches one of the valid residual values for the receiving transceiver, the transceiver accepts the packet. If the calculated residual value does not match any of the valid residual values, the transceiver rejects the packet. In this way, the USB transceiver can ignore unwanted packets.

For the purposes of this disclosure, "accepting" a data packet means, for example, that the packet is forwarded to the protocol layer for processing, in a manner similar to packets that pass a CRC check in conventional CRC schemes. In an illustrative embodiment, when a data packet passes the CRC check, i.e., the residual matches one of the listed valid residual values, the receiving transceiver sends the Good CRC acknowledgement message to the transceiver that sent the packet. For the purposes of this disclosure, "rejecting" a data packet means, for example, that the packet is not forwarded to the protocol layer for processing, similar to packets that fail a CRC check in conventional CRC schemes. In an illustrative embodiment, when a data packet fails the CRC check, i.e., the residual does not match any of the listed valid residual values, the receiving transceiver does not send the Good CRC acknowledgement message to the transceiver that sent the packet.

In a first illustrative embodiment, there are multiple (though, illustratively, a limited number of) unique CRC generator polynomials that can be used in the polynomial division that creates the CRC value. Illustratively, there might be two or three different generator polynomials, though there can be more. This scheme departs from the USB-PD specification, wherein the generator polynomial 04C11 DB7h is used for all CRC calculations. In an illustrative embodiment of the present invention, this 04C11DB7h polynomial defined by the USB-PD specification is just one of multiple generator polynomials that can be used. For reasons explained above, each generator polynomial results in a unique residual value at the receiving transceiver, regardless of the input data (the dividend) used in the CRC calculation. As mentioned, each transceiver maintains a list of which residual values it will accept when receiving a data packet. Each of these valid residual values corresponds to a different generator polynomial. Therefore, the generator polynomial used at the transmitting end will dictate which receivers will accept the packet and which will reject it. Illustratively, if a transmitting transceiver wants to send a message only to a legacy USB-PD device, the transmitter will use the generator polynomial 04C11DB7h defined by the USB specification when generating the CRC value. When this generator polynomial is used, the residual value generated at a receiving USB device will be C704DD7Bh (assuming no data errors occur during transmission). Since legacy USB-PD devices are configured to accept this residual value, such a data packet will be accepted by a legacy device. Similarly, if the transmitting device does not want a packet that it is transmitting to be received by a legacy USB-PD device, it uses a specified generator polynomial that is not equal to 04C11DB7h. This will result in a residual value at the receiving end that is not equal to C704DD7Bh, causing a legacy USB-PD receiver to reject the packet. In this way, legacy USB-PD receivers will ignore packets not intended for them.

In a second illustrative embodiment, the standard generator polynomial 04C11DB7h defined by the USB specification is always used to generate the CRC value, but some or all of the bits of the output of the CRC calculation can be complemented (1s changed to 0s, 0s changed to 1s) in order to distinguish the intended recipient of the message. Thus, a message can be sent either (a) without complementing any part of the CRC output, (b) after complementing all of the bits of the CRC output, or (c) after complementing a subset of bits of the CRC output. Complementing a subset of bits can include, for example, complementing all of the even-numbered bits, or complementing all of the odd-numbered bits. Each of these schemes will result in a unique residual value being generated at the receiving transceiver. As with the first embodiment, each transceiver maintains a list of which residual values it will accept when receiving a data packet. Each of these valid residual values corresponds to one of the above-stated CRC adjustment (or non-adjustment) schemes. Therefore, whether or not the output of the CRC calculation is adjusted, and the means by which it is adjusted, will dictate which receivers will accept the packet and which will reject it. Illustratively, if a transmitting transceiver wants to send a message only to a legacy USB device, the transmitter will not adjust the output of the CRC calculation. When the CRC output is not adjusted, the residual value generated at a receiving USB device will be C704DD7Bh (assuming no data errors occur during transmission). Since legacy USB devices are configured to accept this residual value, such a data packet will be accepted by a legacy device. Similarly, if the transmitting device does not want a packet that it is transmitting to be received by a legacy USB-PD device, it uses one of the aforementioned bit-complementing schemes. This will result in a residual value at the receiving end that is not equal to C704DD7Bh, causing a legacy USB-PD receiver to reject the packet. In this way, legacy USB-PD receivers will ignore packets not intended for them.

Figure 4:
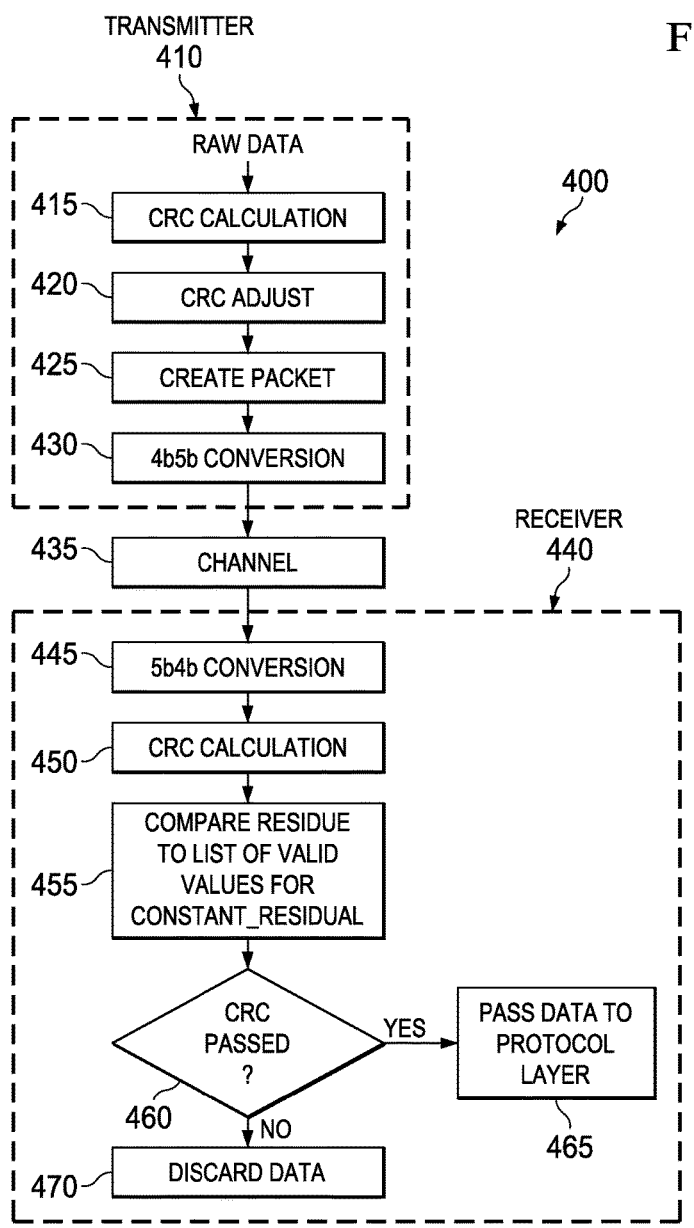
FIG. 4 is a functional block diagram of a USB-PD communication system that uses CRC generation schemes to distinguish intended recipients.

FIG. 4 is a functional block diagram of a USB-PD communication system that uses CRC generation schemes to distinguish intended recipients. The USB-PD communication system 400 includes a transmitter 410 of a first transceiver, a communication channel 435, and a receiver 440 of a second transceiver. The CRC calculation block 415 receives the raw input data, which as previously stated, includes the header 330 and the data bytes 340-346 of the data packet 300 represented by FIG. 3. The CRC calculation block 415 performs the CRC calculation (polynomial division), using the input data as the dividend and using the generator polynomial as the divisor. The output of the CRC calculation 415 is the remainder of the polynomial division. The selection of the CRC generator polynomial, and the CRC adjust block 420, can be used, either individually or in tandem, to distinguish intended recipients of the data packet to be transmitted, as previously described. Packet creation block 425 then creates the data packet, e.g., data packet 300 in FIG. 3, to be transmitted, which includes appending the remainder of the CRC polynomial division, possibly adjusted by the CRC adjust block 420, onto the end of the data blocks 340-346. 4b5b conversion block 430 performs 4b5b encoding on the data packet, which is then transmitted over channel 435 to receiver 440. 5b4b conversion block 445 performs 5b4b decoding on the received data packet. The CRC calculation block 450 then performs the CRC calculation, i.e., dividing the header, data blocks, and CRC code by the generator polynomial. This CRC calculation generates a residual value for reasons explained above. The receiver 440 maintains a list of one or more valid residual values, i.e., residual values which that particular receiver 440 will accept. At block 455, the residual value produced by the CRC calculation 450 is compared against this list of valid values. At decision block, 460, if the residual value matches one of the listed valid values, the data extracted from the data packet is passed to the protocol layer, as indicated by block 465. In an illustrative embodiment, the data is extracted from the data packet after the 5b/4b conversion block 445. If, on the other hand, the calculated residual value does not match any of the listed valid values, that means the data was either corrupted during transmission or was not intended for this receiver 440, and therefore the data is discarded, as indicated by block 470.

In an illustrative embodiment, the transmitter 410 selects a generator polynomial to use in the CRC calculation 415 to indicate an intended recipient of the data packet. A legacy USB-PD transmitter uses 04C11DB7h as its generator polynomial and the CRC adjust block 420 is not present. Assuming no errors occur to the data during transmission over channel 435, the CRC calculation 450 at the receiver 440 receiving such a data packet will produce the legacy residual value C704DD7Bh, regardless of the input data (dividend) to the CRC calculation at the transmitter. If the receiver 440 is a legacy device, its list of valid residual values will consist solely of the legacy residual value C704DD7Bh, and therefore the comparison performed at block 455 will result in a match and the data will be forwarded to the protocol layer. Similarly, if the receiver 440 is not a legacy device but is capable of receiving messages from a legacy device, its list of valid residual values will include the legacy residual value C704DD7Bh, along with possibly other residual values, and therefore the comparison performed at block 455 will result in a match and the data will be forwarded to the protocol layer. If, on the other hand, the receiver 440 is not a legacy device and is not capable of receiving messages from a legacy device, its list of valid residual values will not include the legacy residual value, and therefore the comparison performed at block 455 will not result in a match and the data will be discarded.

A non-legacy transmitter can use a generator polynomial that is not equal to the legacy USB-PD generator polynomial in performing the CRC calculation 415. As previously described, using such a non-legacy generator polynomial will produce a non-legacy residual at the CRC calculation block 450 of the receiver 440. For example, a transmitter 410 in an illustrative embodiment reverses the bit order of the legacy generator polynomial to give a generator polynomial of EDB88320h. If no CRC adjustment is performed at the CRC adjust block 420, this generator polynomial corresponds to a residual value of F3EFFCF8h at the receiver 440. If the receiver 440 is a legacy device, its list of valid residual values will consist solely of the legacy residual value C704DD7Bh, and therefore the comparison performed at block 455 will not result in a match and the data will be discarded. Alternatively, if the receiver 440 is not a legacy device and its list of valid residual values includes the residual value F3EFFCF8h, the comparison performed at block 455 will result in a match and the data will be forwarded to the protocol layer. If, on the other hand, the receiver 440 is not a legacy device but its list of valid residual values does not include the residual value F3EFFCF8h, the comparison performed at block 455 will not result in a match and the data will be discarded. In another example of a non-legacy generator polynomial that can be used in the CRC calculation 415, the bits of the legacy generator polynomial are inverted to give a generator polynomial of FB3EE248h. If no CRC adjustment is performed at the CRC adjust block 420, this generator polynomial corresponds to a residual value of 73A7D233h at the receiver 440.

As mentioned, instead of using alternative generator polynomials to distinguish intended recipients of a message, in some embodiments the CRC adjust block 420 complements some or all of the bits of the output of the CRC calculation in order to distinguish the intended recipient of the message. In an embodiment wherein the CRC adjust block 420 complements every bit of the remainder of the CRC calculation 415, the residual value of the CRC calculation 450 at the receiver 440 will be 00000000h regardless of the generator polynomial and regardless of the input data. Thus if the receiver 440 is a legacy device, it's list of valid residual values will consist solely of the legacy residual value C704DD7Bh, and therefore the comparison performed at block 455 will not result in a match and the data will be discarded. Alternatively, if the receiver 440 is not a legacy device and its list of valid residual values includes the residual value 00000000h, the comparison performed at block 455 will result in a match and the data will be forwarded to the protocol layer. If, on the other hand, the receiver 440 is not a legacy device but its list of valid residual values does not include the residual value 00000000h, the comparison performed at block 455 will not result in a match and the data will be discarded.

Tables 1-5 below illustrate example systems using alternative generator polynomials and/or adjustments to CRC outputs to distinguish intended recipients of data packets. In the illustrative examples of Tables 1-5, transceiver #3 is an in-line transceiver embedded in the USB cable, as in FIG. 1.

Table 1 shows an example of how a system can be configured. In this example, all transceivers use the legacy CRC generator polynomial 04011DB7h. Transceiver #2 is a legacy USB-PD device. Transceiver #1 operates like a master of the bus and can communicate with either transceiver #2 or transceiver #3. When transceiver #1 wants to send a message to transceiver #2, it does not adjust the output of the CRC calculation. When this message is received at transceiver #2, it gives the legacy residual value of C704DD7Bh, which is accepted by transceiver #2 since transceiver #2 is a legacy USB-PD device. When that same message is received at transceiver #3, the resulting residual value C704DD7Bh is compared against the lone valid residual value for transceiver, which is 00000000h. Since the values don't match, transceiver #3 discards the message. When transceiver #1 wants to communicate with transceiver #3, it complements all of the bits of the output of the CRC calculation (note that the term "negates" in Tables 1-5 means "complements" for the purposes of this disclosure and the terms are used interchangeably herein). This complementing of all bits results in a residual value of 00000000h at transceivers #2 and #3. Since transceiver #2 is a legacy transceiver, this value does not match its legacy residual value of C704DD7Bh and the packet is discarded. But at transceiver #3, this residual value does match the valid residual value for that transceiver and the packet is therefore accepted.

Transceiver #1 of Table 1 is configured to receive messages from both transceiver #2 and transceiver #3. Transceiver #2, being a legacy device, only transmits messages using the legacy CRC generation scheme, i.e., using the legacy generation polynomial and not adjusting the output of the CRC calculation. In contrast, transceiver #3 only transmits messages after complementing all of the bits of the output of the CRC calculation. Therefore, transceiver #1's list of valid residual values includes both the legacy residual value (C704DD7Bh) and the "negate all" value (00000000h). Thus messages received at transceiver #1 from both transceiver #2 and transceiver #3 will result in a residual value match and the messages will be accepted. In contrast, messages sent by legacy transceiver #2 will be rejected by transceiver #3 because transceiver #3 accepts only messages producing the "negate all" residual value (00000000h), and not the legacy residual value (C704DD7Bh). Similarly, messages sent by transceiver #3 will be rejected by transceiver #2 because transceiver #2 accepts only messages producing the legacy residual value, and not the "negate all" residual value.

TABLE 1

| Tx | Rx | CRC Adjust | CRC Polynomial at Rx and Tx | Residual Value at Rx |
|---|---|---|---|---|
| #1 | #2 | Nothing | 04C11DB7h | C704DD7Bh |
| #1 | #3 | Negate All | 04C11DB7h | 00000000h |
| #2 | #1 | Nothing | 04C11DB7h | C704DD7Bh |
| #3 | #1 | Negate All | 04C11DB7h | 00000000h |

Table 2 shows an example system configuration wherein transceiver #1 and transceiver #2 can both send and receive messages to/from transceiver #3. All three transceivers use the legacy CRC generator polynomial 04C11DB7h. Both transceiver #1 and transceiver #2 can transmit packets using either the legacy CRC generation scheme or after adjusting the output of the CRC calculation by complementing all bits. And the "valid residual value" lists kept by the receivers of both transceiver #1 and transceiver #2 contain the legacy residual value (C704DD7Bh) as well as a "negate even" residual value (42FC4B29h). Transceiver #3 generates all its messages using the "negate even" CRC generation scheme whereby only the even-numbered bits of the output of the CRC calculation are complemented. Transceiver #3 has only one residual value in its list of valid residual values the "negate all" residual value of 00000000h. Thus transceiver #1 can send either a message that will be accepted only by transceiver #2 or a message that will be accepted only by transceiver #3. Transceiver #1 is unable to send a broadcast message, i.e., a message that will be accepted by both transceiver #2 and transceiver #3. Similarly, transceiver #2 can send either a message that will be accepted only by transceiver #1 or a message that will be accepted only by transceiver #3. Transceiver #2 is also unable to send a broadcast message. Transceiver #3, in contrast, is only capable of sending broadcast messages; all messages sent by transceiver #3 are accepted by both transceiver #1 and transceiver #2.

TABLE 2

| Tx | Rx | CRC Adjust | CRC Polynomial at Rx and Tx | Residual Value At Rx |
|----|----|------------|------------------------------|----------------------|
| #1 | #2 | Nothing | 04C11DB7h | C704DD7Bh |
| #2 | #1 | Nothing | 04C11DB7h | C704DD7Bh |
| #1 | #3 | Negate All | 04C11DB7h | 00000000h |
| #2 | #3 | Negate All | 04C11DB7h | 00000000h |
| #3 | #1 and #2 | Negate Even | 04C11DB7h | 42FC4B29h |

Table 3 shows another example system configuration wherein transceiver #1 and transceiver #2 can both send and receive messages to/from transceiver #3. Transceivers #1 and #2 use the legacy CRC generator polynomial 04C11 DB7h, while transceiver #3 uses the generator polynomial FB3EE248h, which is a bit-by-bit inversion of the legacy generator polynomial. Both transceiver #1 and transceiver #2 can transmit packets using either the legacy CRC generation scheme or after adjusting the output of the CRC calculation by complementing all bits. And the "valid residual value" lists kept by the receivers of both transceiver #1 and transceiver #2 contain the legacy residual value (C704DD7Bh) as well as a residual value 73A7D233h corresponding to the generator polynomial FB3EE248h that is used by the transmitter of transceiver #3. Transceiver #3 has only one residual value in its list of valid residual values—the "negate all" residual value of 00000000h. Thus transceiver #1 can send either a message that will be accepted only by transceiver #2 or a message that will be accepted only by transceiver #3. Transceiver #1 is unable to send a broadcast message, i.e., a message that will be accepted by both transceiver #2 and transceiver #3. Similarly, transceiver #2 can send either a message that will be accepted only by transceiver #1 or a message that will be accepted only by transceiver #3. Transceiver #2 is also unable to send a broadcast message. Transceiver #3, in contrast, is only capable of sending broadcast messages; all messages sent by transceiver #3 are accepted by both transceiver #1 and transceiver #2. In this system, transceiver #3 needs to be able to do CRC calculations with two different CRC generator polynomials depending on if it is transmitting or receiving.

TABLE 3

| Tx | Rx | CRC Adjust | CRC Polynomial at Rx and Tx | Residual Value At Rx |
|----|----|------------|------------------------------|----------------------|
| #1 | #2 | Nothing | 04C11DB7h | C704DD7Bh |
| #2 | #1 | Nothing | 04C11DB7h | C704DD7Bh |
| #1 | #3 | Negate All | 04C11DB7h | 00000000h |
| #2 | #3 | Negate All | 04C11DB7h | 00000000h |
| #3 | #1 and #2 | Nothing | FB3EE248h | 73A7D233h |

Table 4 shows an example system configuration wherein transceivers #1 and #2 each use both generator polynomial variation and adjustment of the output of the CRC calculation to distinguish intended recipients of a message. When transceiver #1 wants to send a message to transceiver #2, it uses the legacy CRC generation scheme, i.e., uses the legacy generator polynomial and does not adjust the output of the CRC calculation. When transceiver #1 wants to send a message to transceiver #3, it uses the alternative generator polynomial FB3EE248h and also complements all of the bits of the output of the CRC calculation. Similarly, when transceiver #2 wants to send a message to transceiver #1, it uses the legacy CRC generation scheme, i.e., uses the legacy generator polynomial and does not adjust the output of the CRC calculation. When transceiver #2 wants to send a message to transceiver #3, it uses the alternative generator polynomial FB3EE248h and also complements all of the bits of the output of the CRC calculation. The "valid residual value" lists kept by the receivers of both transceiver #1 and transceiver #2 contain the legacy residual value (C704DD7Bh) as well as the residual value (73A7D233h) corresponding to the generator polynomial FB3EE248h that is used by the transmitter of transceiver #3. Transceiver #3 has only one residual value in its list of valid residual values the "negate all" residual value of 00000000h. Thus transceiver #1 can send either a message that will be accepted only by transceiver #2 or a message that will be accepted only by transceiver #3. Transceiver #1 is unable to send a broadcast message, i.e., a message that will be accepted by both transceiver #2 and transceiver #3. Similarly, transceiver #2 can send either a message that will be accepted only by transceiver #1 or a message that will be accepted only by transceiver #3. Transceiver #2 is also unable to send a broadcast message. Transceiver #3, in contrast, is only capable of sending broadcast messages. In this system, transceiver #3 need only be able to do CRC calculations with one generator polynomial (FB3EE248h).

TABLE 4

| Tx | Rx | CRC Adjust | CRC Polynomial at Rx and Tx | Residual Value At Rx |
|----|----|------------|------------------------------|----------------------|
| #1 | #2 | Nothing | 04C11DB7h | C704DD7Bh |
| #2 | #1 | Nothing | 04C11DB7h | C704DD7Bh |
| #1 | #3 | Negate All | FB3EE248h | 00000000h |
| #2 | #3 | Negate All | FB3EE248h | 00000000h |
| #3 | #1 and #2 | Nothing | FB3EE248h | 73A7D233h |

In some embodiments, there may be two or more transceivers inside the USB cable and therefore four or more transceivers in the system. In such cases, the number of generator polynomials that can be used can be increased to three or more. Table 5 shows an example of how a system can be configured in such a case. Transceivers #1 and #2 can each use one of three generator polynomials when creating data packets: the legacy generator polynomial 04C11 DB7h, the bit-wise inversion of the legacy generator polynomial (FB3EE248h), or the reversed bit-order of the legacy generator polynomial (EDB88320h). The "valid residual value" lists kept by the receivers of both transceiver #1 and transceiver #2 contain the legacy residual value (C704DD7Bh) as well as the residual value 00000000h corresponding to the "negate all" CRC adjustment that is used by the transmitters of transceivers #3 and #4. The lone residual value in transceiver #3's list of valid residual values is 73A7D233h, which corresponds to the FB3EE248h generator polynomial that can be used by the transmitters of both transceiver #1 and transceiver #2. The lone residual value in transceiver #4's list of valid residual values is F3EFFFCF8h, which corresponds to the EDB88320h generator polynomial that can be used by the transmitters of both transceiver #1 and transceiver #2. Thus transceiver #1 can send either a message that will be accepted only by transceiver #2, a message that will be accepted only by transceiver #3, or a message that will be accepted only by transceiver #4. Transceiver #1 is unable to send a message that will be accepted by more than one transceiver. Similarly, transceiver #2 can send either a message that will be accepted only by transceiver #1, a message that will be accepted only by transceiver #3, or a message that will be accepted only by transceiver #4. Transceiver #2 is also unable to send a message that will be accepted by more than one transceiver. Transceiver #3 is only capable of sending messages that will be accepted by both transceiver #1 and transceiver #2. Similarly, transceiver #4 is only capable of sending messages that will be accepted by both transceiver #1 and transceiver #2. Transceivers #3 and #4 are incapable of sending messages to each other. In this configuration, transceiver #3 and transceiver #4 need only be able to do CRC calculations with one CRC polynomial. If N other nodes are added to the line between transceivers #1 and #2, they still need only store two valid residual values and be able to use 2*N+1 generator polynomials. Thus, this configuration is very scalable.

TABLE 5

| Tx | Rx | CRC Adjust | CRC Polynomial at Rx and Tx | Residual Value At Rx |
|---|---|---|---|---|
| #1 | #2 | Nothing | 04C11DB7h | C704DD78h |
| #2 | #1 | Nothing | 04C11DB7h | C704DD78h |
| #1 | #3 | Nothing | FB3EE248h | 73A7D233h |
| #2 | #3 | Nothing | FB3EE248h | 73A7D233h |
| #3 | #1 and #2 | Negate All | FB3EE248h | 00000000h |
| #1 | #4 | Nothing | EDB88320h | F3EFFCF8h |
| #2 | #4 | Nothing | EDB88320h | F3EFFCF8h |
| #4 | #1 and #2 | Negate All | EDB88320h | 00000000h |

It is to be understood that the above examples are merely illustrative and it can be appreciated from these few examples that the concepts disclosed herein can enable a veritable plethora of configurations. Once this physical layer solution is incorporated, an in-line transceiver, such as transceiver #3 in the above examples (transceiver 140 in FIG. 1), can send and receive data to transceiver #1 (transceiver 110 in FIG. 1) and/or transceiver #2 (transceiver 120 in FIG. 1) without disrupting communications between transceivers #1 and #2 even though they use the same wire to communicate.

FIG. 5 is a flowchart representing a method of operating a communication system comprising three or more communication transceivers. At step 510, a plurality of different cyclic redundancy check (CRC) generation schemes are maintained. Each CRC generation scheme corresponds to a unique CRC residual value. At step 520, a CRC value generated using one of the plurality of CRC generation schemes is placed in a data packet to be transmitted. The chosen CRC generation scheme reflects which one or more transceivers are intended recipients of the data packet. At step 530, when a data packet is received by a transceiver, a CRC residual value is calculated based on the CRC value contained in the received data packet, the calculated CRC residual value is compared against a list of one or more valid CRC residual values for said transceiver, and, if the calculated CRC value matches one of the listed valid CRC residual values, the data packet is accepted, otherwise it is rejected.

In an illustrative embodiment, in addition to accepting or rejecting a data packet based on the calculated CRC residual value, a receiver can also process an accepted packet differently depending on its residual value. Thus, if the calculated residual value matches a first residual value in the list of valid residual values, the receiver might process the packet in a first manner, while if the calculated residual value matches a second residual value in the list of valid residual values, the receiver might process the packet in a second manner. The effect of such a scheme would be that the packet would be processed differently depending on what transceiver sent the packet. For example, in certain embodiments, the data in the data packet could be defined or formatted in different ways depending on which CRC value was matched.

FIG. 6 is a flowchart representing a method of operating a data transmitter to indicate an intended one or more recipients of a data packet to be transmitted. At step 610, a plurality of different cyclic redundancy check (CRC) generation schemes is maintained. Each CRC generation scheme corresponds to a unique CRC residual value. Also, each CRC generation scheme is associated with one or more transceivers that are potential communication partners. At step 620, one or more transceivers that are intended recipients of a data packet to be transmitted are determined. At step 630, one of the CRC generation schemes is selected based on which one or more transceivers are intended recipients of the data packet. At step 640, a CRC value is generated using the selected CRC generation scheme. At step 650, the generated CRC value is placed in the data packet to be transmitted.

FIG. 7 is a flowchart representing a method of operating a data receiver to determine if it is an intended recipient of a received data packet. At step 700, a list of one or more valid CRC residual values is maintained. At step 710, a transmitted data packet is received. At step 720, a CRC residual value is calculated based on a CRC value contained in the received data packet. At step 730, the calculated CRC residual value is compared against the list of valid CRC residual values. At step 740, if the calculated CRC value matches one of the listed valid CRC residual values, the data packet is accepted, otherwise it is rejected.

Having thus described circuits and methods for distinguishing intended recipients of a data packet using CRC generation schemes by reference to certain of their preferred embodiments, it is noted that the embodiments disclosed are illustrative rather than limiting in nature and that a wide range of variations, modifications, changes, and substitutions are contemplated in the foregoing disclosure. For example, while certain aspects of the invention are described with respect to a USB power delivery communication system, it will be understood that such aspects can also be applied to other types of communication systems other than USB-PD systems. Furthermore, in some instances, some features may be employed without a corresponding use of the other features. Accordingly, it is appropriate that the appended claims be construed broadly and in a manner consistent with the broad inventive concepts disclosed herein.

What is claimed is:
1. A method of operating a communication system, the method comprising:
 maintaining a plurality of different cyclic redundancy check (CRC) generation schemes, each CRC generation scheme corresponding to a respective unique CRC residual value;

placing, in a data packet to be transmitted, a CRC residual value generated using a chosen one of said plurality of CRC generation schemes, the chosen CRC generation scheme reflecting which one or more of a plurality of transceivers is/are intended as recipient(s) of said data packet;

communicating the data packet to the plurality of transceivers, including at least first and second transceivers:

when the data packet is received by the first transceiver:
calculating a first CRC residual value based on data contained in the received data packet;
comparing the calculated first CRC residual value against a list of one or more valid CRC residual values stored with said first transceiver; and
if the calculated first CRC residual value matches one of the listed valid CRC residual values stored with said first transceiver, accepting said data packet by said first transceiver, and otherwise rejecting said data packet by said first transceiver; and when the data packet is received by the second transceiver:
calculating a second CRC residual value based on data contained in the received data packet;
comparing the calculated second CRC residual value against a list of at least two valid CRC residual values stored with said second transceiver, wherein at least one of the at least two valid CRC residual values stored with said second transceiver matches at least one valid CRC residual value stored with said first transceiver; and
if the calculated second CRC residual value matches one of the listed at least two valid CRC residual values stored with said second transceiver, accepting said data packet by said second transceiver, and otherwise rejecting said data packet by said second transceiver.

2. The method of claim 1 wherein the communication system is a universal serial bus (USB) communication system and wherein said transceivers comprise USB transceivers.

3. The method of claim 2 wherein at least one of said transceivers is an in-line transceiver residing in a USB cable and operable to transmit information to one or more other transceivers regarding characteristics of the USB cable.

4. The method of claim 1 wherein each of the plurality of different CRC generation schemes uses a different CRC generator polynomial to generate the CRC residual value.

5. The method of claim 4 wherein one of the plurality of CRC generation schemes uses a legacy USB generator polynomial to generate the CRC residual value.

6. The method of claim 1 wherein a first of the plurality of CRC generation schemes comprises complementing some or all of the bits of the remainder of the CRC polynomial division, and wherein a second of the plurality of CRC generation schemes comprises not complementing any of the bits of the remainder of the CRC polynomial division.

7. The method of claim 1 wherein a first of the plurality of CRC generation schemes comprises complementing a first subset of the bits of the remainder of the CRC polynomial division, and wherein a second of the plurality of CRC generation schemes comprises complementing a second subset of the bits of the remainder of the CRC polynomial division.

8. The method of claim 1 wherein said list of one or more valid CRC residual values includes a legacy CRC residual value corresponding to a legacy CRC generation scheme.

9. A method of operating a first data receiver to determine whether it is an intended recipient of a received data packet, the method comprising:
maintaining a list of at least two valid CRC residual values locally with the first data receiver, wherein at least one of the at least two valid CRC residual values is not C704DD7Bh and matches a valid CRC residual value stored with a second receiver; wherein the h at the end of C704DD7Bh means an actual residual value is hexadecimal;
receiving a transmitted data packet;
calculating a CRC residual value based on data contained in the received data packet;
comparing the calculated CRC residual value against the list of valid CRC residual values; and
if the calculated CRC residual value matches one of the listed valid CRC residual values, accepting said data packet, and otherwise rejecting said data packet.

10. The method of claim 9 wherein said first data receiver comprises a universal serial bus (USB) receiver.

11. The method of claim 10 wherein said USB data receiver comprises an in-line transceiver residing in a USB cable and operable to transmit information to one or more other USB transceivers regarding characteristics of the USB cable.

12. The method of claim 9 wherein the list of valid CRC residual values includes a legacy CRC residual value corresponding to a legacy CRC generation scheme.

* * * * *